United States Patent [19]

Jaspers

[11] Patent Number: 5,353,867
[45] Date of Patent: Oct. 11, 1994

[54] HEAT EXCHANGER, A METHOD OF MANUFACTURING SAME, AND APPLICATIONS

[75] Inventor: Martinus J. Jaspers, Nuenen, Netherlands

[73] Assignee: Akzo Nobel nv, Arnhem, Netherlands

[21] Appl. No.: 37,942

[22] Filed: Mar. 26, 1993

[30] Foreign Application Priority Data

Mar. 31, 1992 [NL] Netherlands .................. 9200590

[51] Int. Cl.⁵ ........................................ F28F 3/12
[52] U.S. Cl. ............................. 165/165; 165/168; 361/690
[58] Field of Search ............ 165/164, 165, 168, 170, 165/908; 361/690

[56] References Cited

U.S. PATENT DOCUMENTS

| | | | |
|---|---|---|---|
| 3,361,195 | 1/1968 | Meyerhoff et al. | 165/170 |
| 4,016,928 | 4/1977 | Bartels et al. | 165/165 X |
| 4,147,210 | 4/1979 | Pronko et al. | 165/165 |
| 4,359,181 | 11/1982 | Chisholm | 165/164 X |
| 4,624,305 | 11/1986 | Rojey | 165/165 |
| 4,777,560 | 10/1988 | Herrell et al. | 165/185 X |
| 4,898,234 | 2/1990 | McGovern et al. | 165/170 |
| 5,058,665 | 10/1991 | Harada | 165/164 |
| 5,193,611 | 3/1993 | Hesselgreaves | 165/165 |
| 5,205,353 | 4/1993 | Willemsen et al. | 165/170 |
| 5,212,625 | 5/1993 | Van Andel et al. | 361/690 |

FOREIGN PATENT DOCUMENTS

| | | |
|---|---|---|
| 243710 | 11/1987 | European Pat. Off. |
| 267772 | 5/1988 | European Pat. Off. |
| 278240 | 8/1988 | European Pat. Off. |
| 285779 | 10/1988 | European Pat. Off. |
| 376365 | 7/1990 | European Pat. Off. |
| 2401525 | 3/1979 | France |
| 1677477 | 9/1991 | U.S.S.R. ............... 165/164 |

Primary Examiner—John Rivell
Assistant Examiner—L. R. Leo
Attorney, Agent, or Firm—Louis A. Morris; Richard P. Fennelly; James K. Poole

[57] ABSTRACT

A heat exchanger having on a first and a second side inlets and outlets, respectively, for a preferably gaseous heat exchanging medium, and having a heat exchanging component made of a high thermal conductive material, such as metal, and comprised of a package of lamellae, in which the heat exchanging material has a structure permeable to the heat exchanging medium, and in which channels for the medium passing from the inlet side to the outlet side are formed, such that medium flowing in via the inlet channels can flow to the adjacent outlet channels at an angle to the direction of entry via the heat exchanging material.

32 Claims, 10 Drawing Sheets

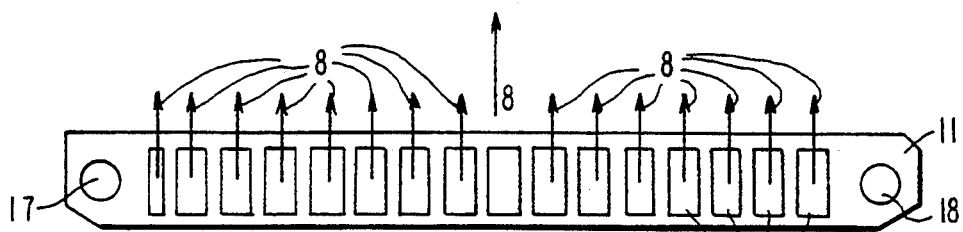
FIG.2A
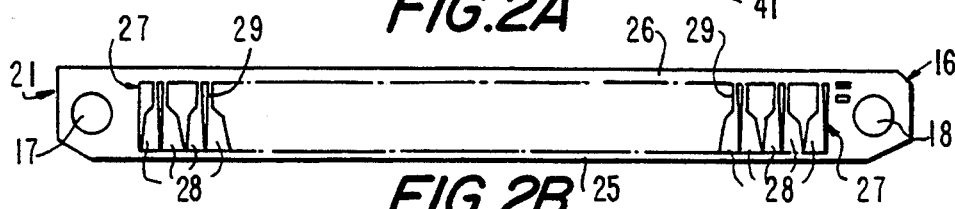
FIG.2B
FIG.2C
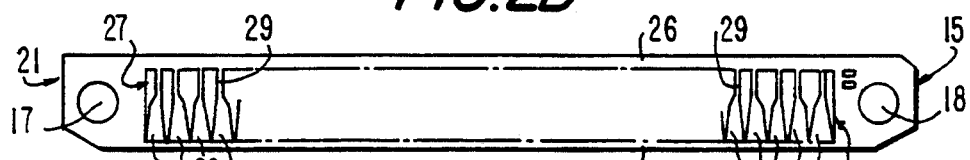
FIG.2D
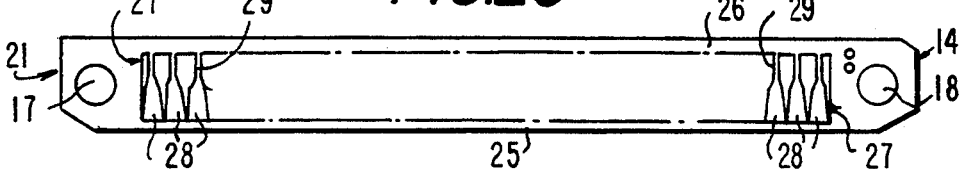
FIG.2E
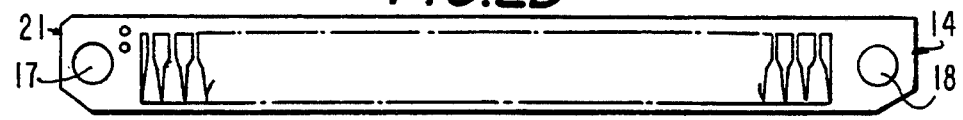
FIG.2F
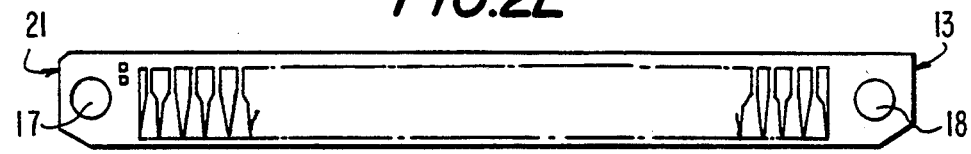
FIG.2G
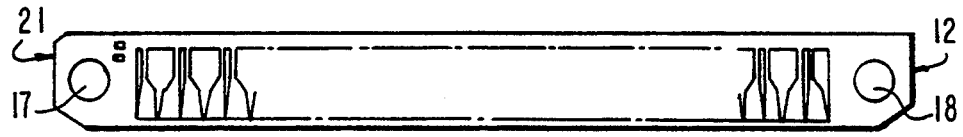
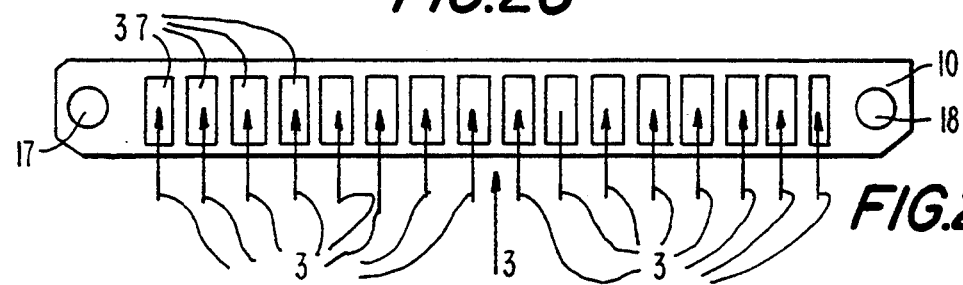
FIG.2H

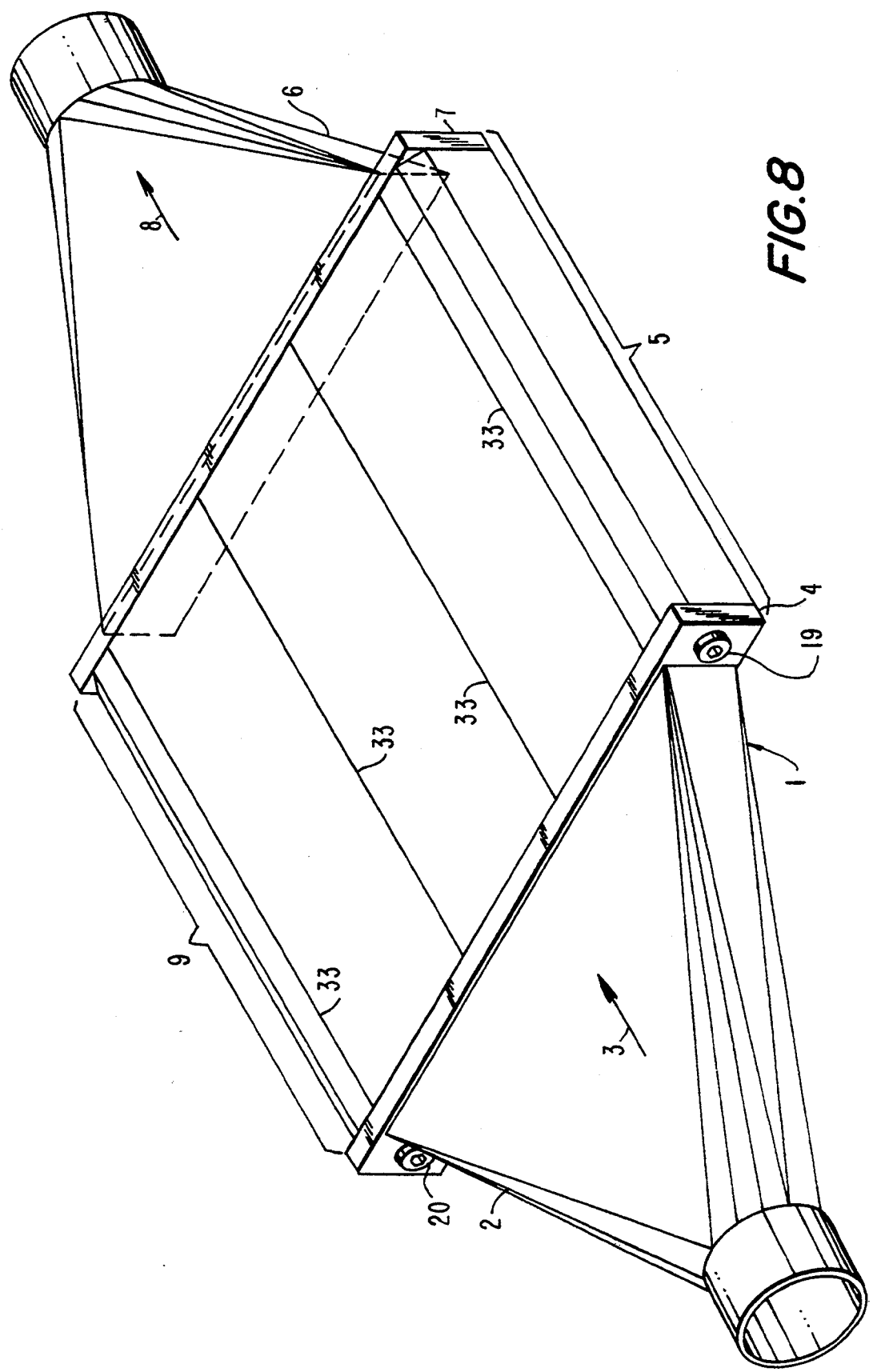

HEAT EXCHANGER, A METHOD OF MANUFACTURING SAME, AND APPLICATIONS

BACKGROUND OF THE INVENTION

SUMMARY OF THE INVENTION

The invention relates to a heat exchanger having, on a first and a second side, inlets and outlets, respectively, for a preferably gaseous heat exchanging medium, and having a heat exchanging component made of a high thermal conductive material, such as metal, in which the heat exchanging material has a structure permeable to the heat exchanging medium, and, in which material, channels, positioned side by side and passing from the inlet side to the outlet side, are formed, such that medium flowing in via the inlet channels can flow to the adjacent outlet channels at an angle to the direction of entry into the heat exchanging material. Further, the invention relates to a method of manufacturing such a heat exchanger. Also, the invention comprises applications of such a heat exchanger.

Such a heat exchanger is known from European Patent Publication No. 376,365. In that case, the heat exchanging material in the heat exchanging component is composed of rows of thin wire elements which are virtually triangular in cross-section and project from the base of the triangular shape. All this produces a particularly large heat dissipating surface area, making it possible, notably on account of the special way in which the gaseous heat exchanging medium is compelled to flow, to attain an exceptionally high heat transfer. However, manufacturing the known heat exchanger is not so easy, particularly in the case of larger runs or mass production.

The invention has for its object to provide a heat exchanger of the type mentioned in the opening paragraph with a high coefficient of heat transfer, of which, in principle, large runs can be manufactured simply and efficaciously and for which mass production is readily workable. The heat exchanger according to the invention is characterized firstly in that the heat exchanging component is comprised of a number of lamellae assembled or joined in the form of a permeable package or structure, the lamellae being made of a foil, preferably of copper, of a thickness of 5 to 1000 $\mu$m, with the desired pattern of the permeable structure and with inlet and outlet channels being formed in the foil. The at least partially contacting lamellae each extend substantially in a direction transverse to the longitudinal direction of the intermediate inlet and outlet channels.

A particularly favorable embodiment of the heat exchanger is characterized according to the invention in that said permeable structure in each lamella is made of one and the same foil and is formed integral with a base strip to which heat is fed during operation, and that the adjacent base strips of successive lamellae in the package together form a base plate, with the permeable structure in a lamella at the side opposite to the base strip being formed integral with a bearing strip, preferably with the permeable structure in a lamella at the side facing away from the base strip being provided with a vertical top strip formed integral therewith, such that the top strips of successive lamellae form baffles for the medium, the top strips in a lamella preferably being formed integral with the bearing strips. According to the invention, it is of advantage for the base strip and the bearing strip in each lamella to be joined at their ends to connecting strips formed integral therewith.

A preferred embodiment of the heat exchanger is characterized according to the invention in that the permeable structure is formed by a lattice of straight and/or curved lattice bars disposed in the plane of a lamella and having a width, in the plane of the lamella, of 5 to 1000 $\mu$m, measured in the direction parallel to the base strip, it being preferred for the permeable structure in a lamella in the direction away from the base strip to have, for instance, a gradually, narrowing width in the plane of the lamella, with successive permeable structures in a lamella virtually connecting where their widths at the base strip are greatest, or being not more than 5 to 1000 $\mu$m removed from each other.

Favorable results have been obtained with a heat exchanger characterized according to the invention in that the permeable structure in a lamella is formed by a group of straight and/or curved lattice bars or lattice wires extending toward the base strip in the shape of a fan. The heat exchanger according to the invention is advantageously characterized in that the circumferential or side edges of the permeable structures of successive lamellae constitute permeable side walls of said inlet and outlet channels for the medium. According to the invention, it is possible to attain good medium permeability when the heat exchanger is characterized in that the construction of the lamellae is such that lattice bars at the circumferential edges of the permeable structures in successive lamellae are staggered. An efficacious embodiment of the heat exchanger is characterized according to the invention in that the construction is such that the width of the inlet channels in the heat exchanging medium feed direction decreases, e.g. gradually or stepwise, while the width of the medium outlet channels in the medium discharge direction increases, e.g. gradually or stepwise. Satisfactory thermal conduction from the heat generating source to the heat exchanger is obtained when the heat exchanger according to the invention is characterized in that the adjacent, base plate-forming base strips of successive lamellae are ground flat on the side facing away from the open structures. Proper unity of the heat exchanging component is obtained when the heat exchanger according to the invention is characterized in that the lamellae forming the heat exchanging component are fixedly interconnected to form a package by means of two or more welding zones provided on the outside of the package. The complicated shaping of the lamellae can be effected with great accuracy in a simple and economical manner even in mass manufacturing if, according to the invention, the desired permeable structure pattern, the inlet and outlet channel widths in the medium, and the base strip are formed by an operation selected from the group of etching, more particularly photochemical etching, build-up, and punching.

According to the invention, the heat exchanger can be efficaciously manufactured when the manufacturing method is characterized in that a plurality, say 100 to 10,000, of lamellae having the desired pattern of the permeable structure and the width of the inlet and outlet channels in the medium are stacked one on top of the other in the desired relative arrangement and pressed together in the form of a package, after which the lamellae are interconnected, preferably by welding on the outside of the package, the welded joint being made with, say, a laser beam or an electron beam. According to the invention, it is of advantage for the package of fixedly joined lamellae to be ground flat at the base strip side of the lamellae facing away from the open structures, and for the lamellae having the desired permeable structure pattern, the inlet and outlet channel widths in the medium, the base strip, the bearing strip and, optionally, the top strip to be made of a foil, preferably a metal foil. According to the invention, the lamellae can be formed from foil in an efficacious manner by an operation preferably selected from the group of etching, more particularly photochemical etching, and punching, the advantage of the process being that it comprises forming a plurality of lamellae side by side in a flat strip of foil, after which, according to the invention, the strip of foil containing a plurality of lamellae is conveyed to a place for mounting or stacking, where the lamellae are removed from the strip of foil, e.g. piece by piece, and then interconnected or stacked in the desired relative arrangement.

According to the invention, the heat exchanger of the described type according to the invention can be employed with advantage in a semi-conductor module comprising at least one semi-conductor chip which is directly or indirectly connected to said heat exchanger base plate at the back.

In the aforementioned etching process the excess material is removed from the foil by etching, which may be referred to as a subtractive method. An alternative manufacturing method, which may be called additive, comprises the electrochemical build-up or deposition on a carrier of metal, more particularly copper, in the pattern desired for the lamella, followed by removal of the carrier.

The invention further comprises a device for heating or cooling, such as a Peltier element, or for use in a car, said device being provided with a power source which is selected from an accumulator, solar cells, batteries or other sources of energy not permanently connected to the supply system, and equipped with a heat exchanger of the above-described type according to the invention. Notably the use of the heat exchanger according to the invention in heating or cooling devices of the types mentioned may give substantial savings in weight and space, it being possible to make the lamellae of aluminum, instead of copper, if so desired.

Another type of heat exchanger, more particularly for cooling electronic components, is disclosed in European Patent Publication No. 267,772. In this case, the cooling member is comprised of a plurality of substantially parallel plate-type cooling fins, said plates being approximately in the shape of a right-angled triangle and mounted, with their bottom shortest legs, side by side, on a base element which absorbs the heat of heat-generating electronic components. The cooling fins are so mounted on the base that the hypotenuses of consecutive fins intersect. Between the upper sections of consecutive cooling fins passageways for cooling air are provided. In the embodiment according to FIGS. 7–10 of this European patent publication a plurality of consecutive cooling fins have been folded from a single strip of metal foil.

European Patent Publication No. 278,240 discloses a different type of cooling member for electronic components, which is substantially comprised of a number of spaced apart parallel flat lamellae mounted on a base plate with heat generating elements. Alternatively, the lamellae may be made from a corrugated metal sheet.

French Patent No. 2,401,525 describes a heat exchanger with flat cooling ribs for use in a thermoelectric device on the basis of the Peltier effect.

In European Patent Publication No. 243,710 a semiconductor module is described having a heat exchanger with conventional fins standing up from a flexible sheet of thermally conductive material sufficiently large to cover an array of chips.

European Patent Publication No. 285,779 describes a different type of cooling system for semi-conductor modules. More particularly, the FIG. 4 embodiment shown in this patent publication has a number of rows of parallel spaced plate-type cooling fins with special spacers provided therebetween. The groups of cooling fins are mounted on a base element which absorbs the heat generated by a number of semiconductor chips. Such an apparatus is a comparatively complex one, particularly in view of the special coolant ducts having arched top walls and flat heavy bottom walls.

BRIEF DESCRIPTION OF THE DRAWINGS

The present invention will be further illustrated with reference to the schematic drawings which form a part of this specification wherein:

FIG. 2 gives an indication of the placement of the lamellae in the heat exchanger component;

FIG. 8 is a view of a lamellae package with several welded seams thereon;

In FIG. 1 the heat exchanger according to the invention is indicated in its entirety by the reference numeral 1. Wholly excluded from FIG. 1 is the device with a heat generating source whose heat has to be removed by cooling with the aid of the heat exchanger according to the invention. At the front of the heat exchanger 1 there is an only partially drawn diverging inlet housing 2, which diverges from the direction of flow of the air constituting the cooling medium which flows in along the arrow 3. The inlet housing 2 is connected to the mounting beam 4 of the heat exchanging component indicated in its entirety with reference numeral 5. At the back of the heat exchanger 1 an outlet housing 6 is connected to the mounting beam 7 of the heat exchanging component 5. The outlet housing 6 converges towards the direction of flow of the air flowing from the heat exchanging component 5 along the arrow 8. In the depicted embodiment, the heat exchanging component 5 contains a lamellae package 9 of 100 mm×100 mm (length×width) and of approximate 13 mm (height). The lamellae package 9 has an inlet lamella 10 at the front and an outlet lamella 11 at the back made of copper foil and etched with the desired pattern of holes. In between the inlet and outlet lamellae 10 and 11 are positioned five groups 12, 13, 14, 15, and 16 each containing 200 lamellae, the five groups thus containing, in all, 1000 lamellae of a thickness of 0.1 mm each. For clarity in respect of the build-up of the lamellae package 9, only a few of the lamellae from the lamellae groups 12 through 16 of FIG. 1 have been drawn in their proper order in FIG. 2 between the inlet lamella 10 and the outlet lamella 11. As is clear from FIG. 2, all 1000 lamellae as well as the inlet and outlet lamellae 10 and 11 have circular mounting holes 17, 18 at their ends. Through the mounting holes 17, 18 in the lamellae and the corresponding holes in the mounting beams 4 and 7 are passed long mounting bolts 19 and 20, of which only the center lines have been drawn in FIG. 1.

Figure 3:
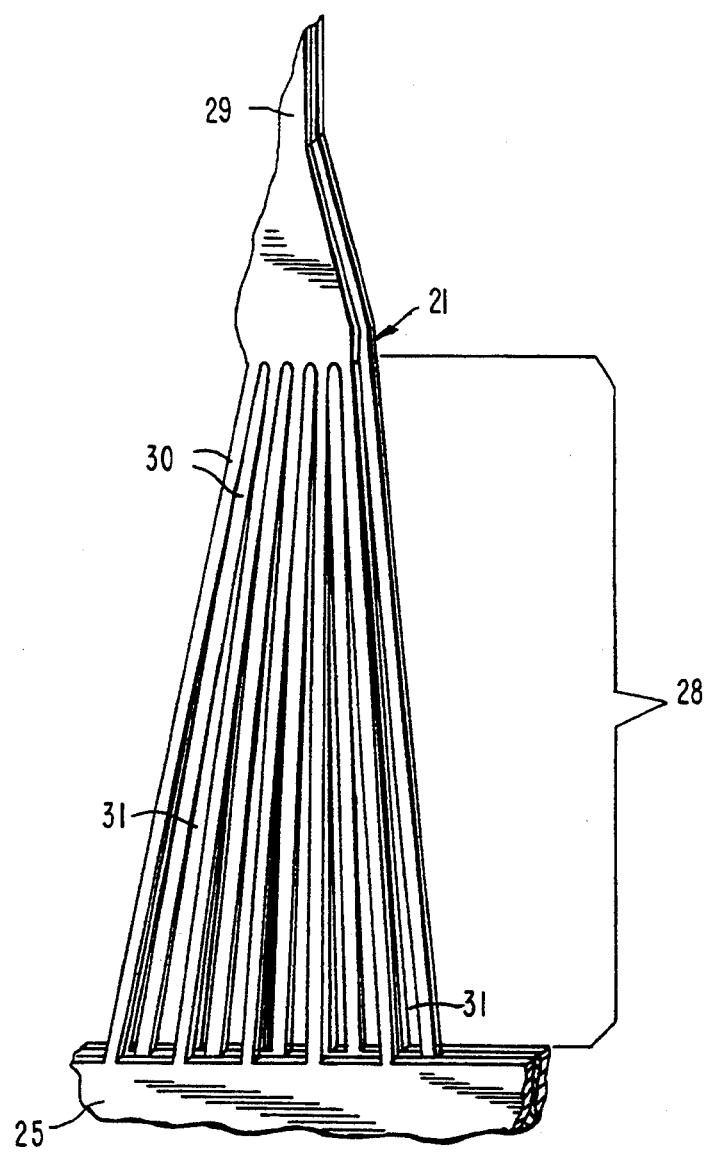
FIG. 3 is a perspective view of a section of three successive lamellae.
Figure 4:
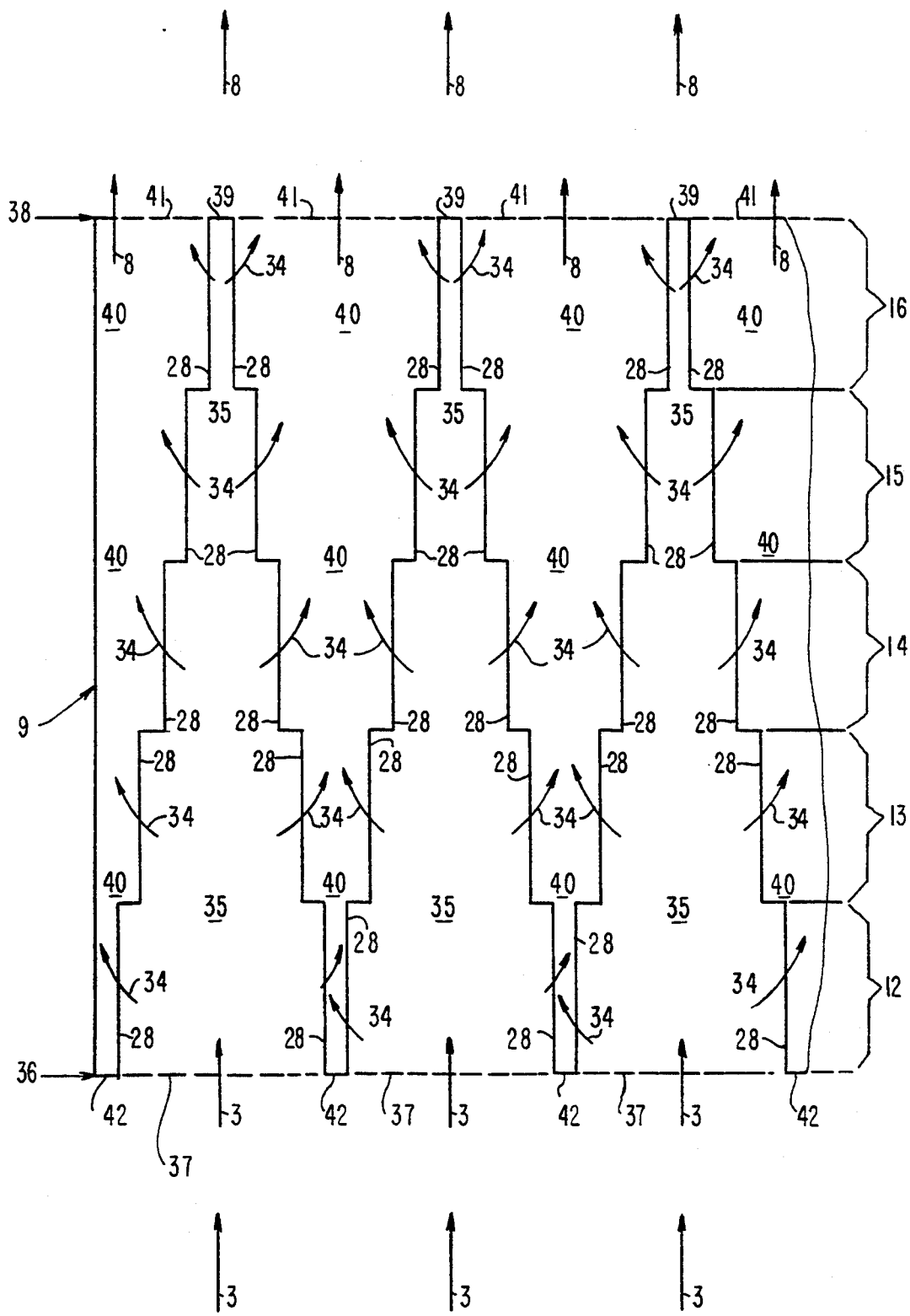
FIG. 4 is a schematic top view of the course of a gaseous medium's flow.
Figure 5:
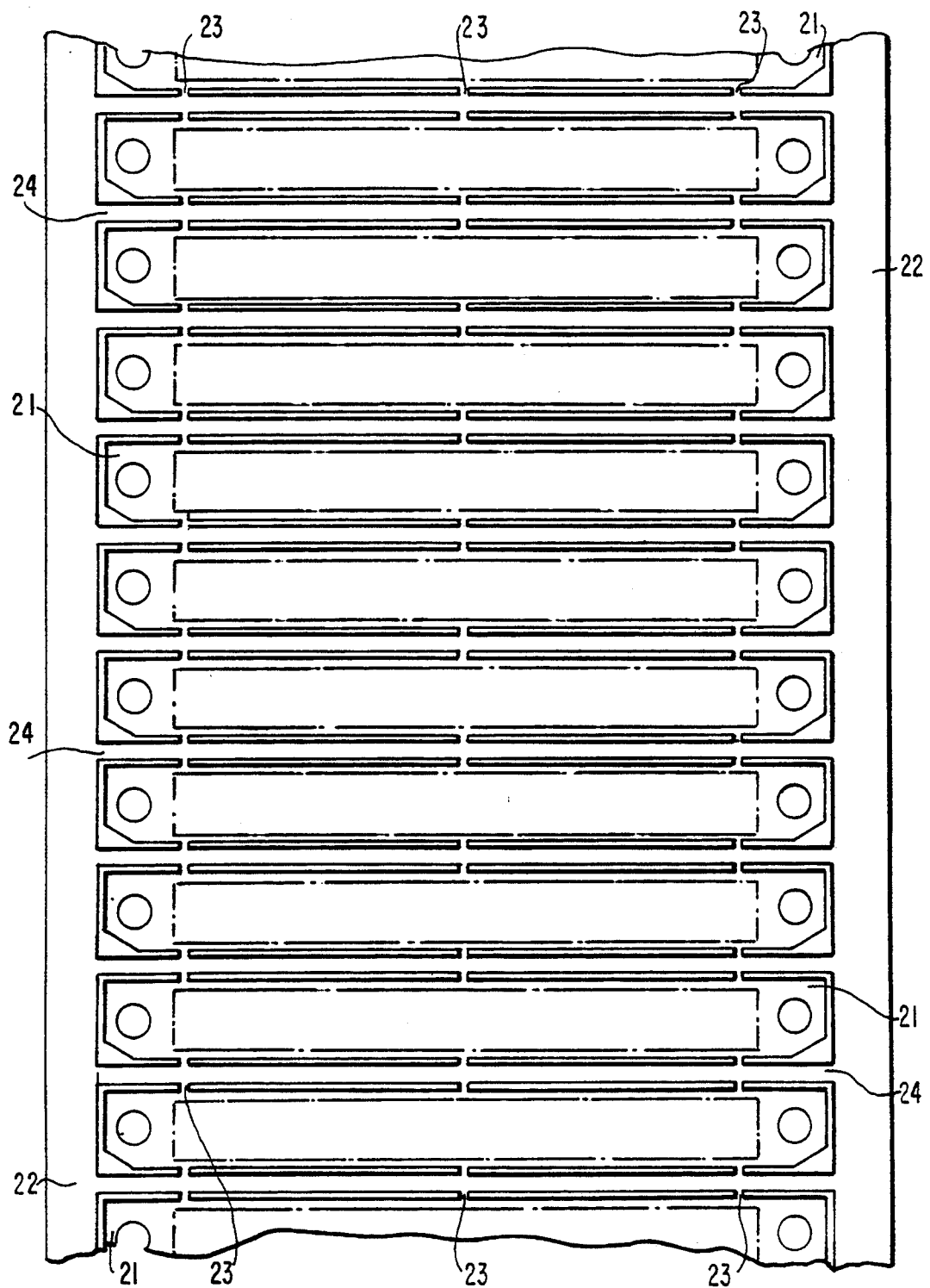
FIG. 5 is a view of a section of a flat strip of foil with lamellae shaped therein.
Figure 6:
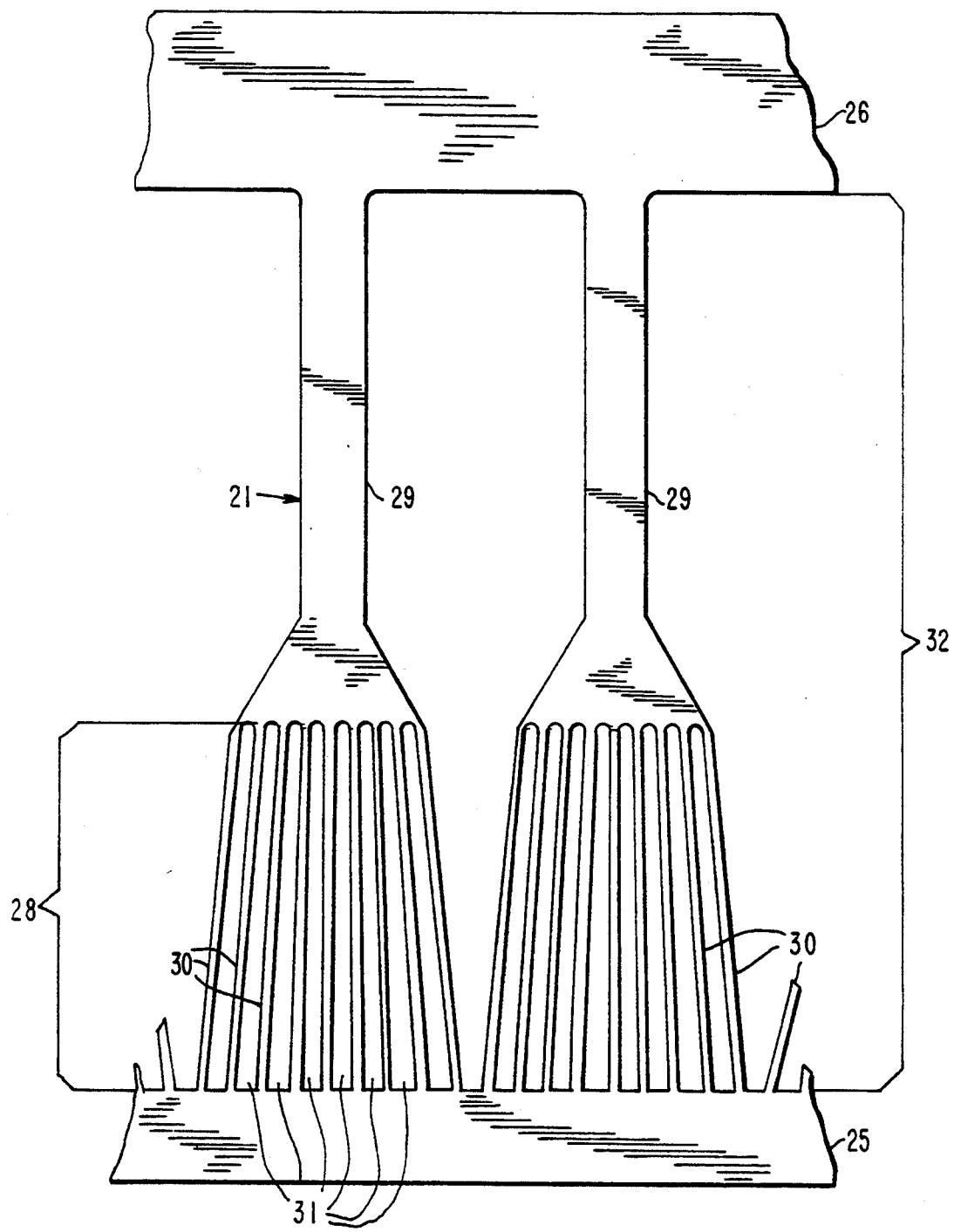
FIG. 6 is an enlarged view of a section of a lamella.

As is clear from FIGS. 1 through 6, particularly from FIG. 6, the lamellae from the five groups 12 through 16 shown, while mutually somewhat divergent, all belong by and large to the type indicated in its entirety with 21 in FIG. 6. The lamella 21 is manufactured from a copper foil 22 of 0.1 mm thick with the aid of a photochemical etching process known to persons of ordinary skill in the art. This permits easy manufacturing of a large number of lamellae 21 from a copper foil 22. All this is clear from FIG. 5, which depicts a copper foil 22 with a number of lamellae 21 shaped therein. The lamellae in FIG. 5 are still attached to the foil 22 by short connecting strips 23 and separation strips 24. It will be obvious that, given a foil of sufficient length, hundreds or thousands of lamellae can be made from the foil 22 shown in FIG. 5.

As is illustrated in particular on a highly enlarged scale in FIG. 6, the circumference of the lamella 21, like that of all other lamellae from the five groups 12 through 16, is formed by a base strip 25, a bearing strip 26, and connecting strips 27. In between the base strip 25 and the bearing strip 26 there is provided in each lamella 21 a large number of cross connections 32 each made up of said permeable structure 28 and a top strip 29. In the drawn embodiment of said cross connections 32 are provided in a lamella of 100 mm in length and the permeable structure 28 is composed of a type of lattice having nine straight lattice bars or cooling fins 30, which at the transition to the base strip 25 in the plane of the foil have a width of, say, about 0.1 mm. In the case of a starting foil of about 0.1 mm thick, the cooling fins 30 will have an approximately square cross-section of about 0.1×0.1 mm. Going upward, i.e., further away from the base strip 25, the cooling fins 30 gradually narrow. In between the cooling fins 30 are open interspaces 31, which have a width of about 0.2 mm at the base strip 25 and an also narrowing width in upward direction. Together with the interspaces 31 the cooling fins 30 form the permeable structure 28 in the form of a type of lattice of approximately trapezoidal circumference with a base of about 2.5 to 3 mm long, a top of about 1.5 mm long, and a height of about 3.5 mm. At the top, the permeable structure 28 blends with said top strip 29, which at its upper end is formed integral with the bearing strip 26. At its upper end the top strip 29 has a width of, say, about 0.5 mm for an overall length of, say, about 6.5 mm. As is clear from FIG. 1, the base strips 25 of the lamellae pressed hard together jointly form a base plate, which, after the approximately 1000 pressed together lamellae have been fixedly interconnected by welding, is very thoroughly ground flat. The welding may be by means of a special laser beam with which four welded seams 33 (see FIG. 8) are formed on the outer sides of the heat exchanging component 5. As is also clear from FIG. 1, the bearing strips 26 of the 1000 pressed together lamellae jointly form a top surface or cover for the heat exchanging component 5 and the lamellae package 9.

In explanation of the build-up of the overall lamellae package 9, composed of five lamellae steps 12 through 16, a schematic, simplified top view of it is shown in FIG. 4. By way of simplification, the permeable structures 28 of the successive lamellae shown on an enlarged scale in FIG. 6 are indicated only with lines in the package 9. By way of illustration of the operation of the heat exchanger, in FIG. 4 the arrows 3 indicating the supplied cooling air inlet flow and the arrows 8 indicating the discharged cooling air outlet flow are also depicted. The flows of cooling air between the cooling fins of the permeable structures 28 are indicated schematically with the arrows 34. The cooling air can flow along the arrows 34 because the cooling fins 30 in the permeable structures of successive lamellae are staggered, as is illustrated in FIG. 3. As is clear from FIGS. 1, 2, and 4, the interspaces between the rows of permeable structures 28 of the successive lamellae constitute feeding or inlet channels 35 for the cooling air, which is introduced as indicated by the direction of the arrows 3. The inlet channels 35 are provided with open inlet ends 37 at the front end 36 of the lamellae package 9 and closed off at the rear end 38 of the lamellae package at 39.

Also, interspaces between the rows of permeable structures 28 of the successive lamellae constitute discharge or outlet channels 40 for the cooling air, which is discharged in the direction of the arrows. The outlet channels 40 are provided with open outlet ends 41 at the rear end of the lamellae package 9 and closed off at the front end 36 of the lamellae package at 42.

In consequence of the construction described and the shape of the lamellae having special permeable structures 28 and top strips 29, a large number of adjacent alternating cooling air inlet channels 35 and cooling air outlet channels 40 are formed in the lamellae package 9 of the heat exchanging component 5. The width of the inlet channels 35 narrows and decreases stepwise in the cooling air feed direction 3, while the width of the outlet channels 40 widens and increases step-wise in the cooling air discharge direction 8, all in similar manner to that described in European Patent Publication No. 376,365.

The build-up of the lamellae package 9 of heat exchanging component 5 can also be seen from FIG. 2 since in each case at least one of the lamellae from the five steps 12 through 16 has been drawn. From its bottom towards top, FIG. 2 shows, firstly, the aforesaid inlet lamella 10, followed by, successively, the first, second, third, fourth, and fifth steps 12, 13, 14, 15, and 16, respectively, each comprising 200 lamellae, and the outlet lamella 11. The lamellae in the five steps are all made of copper foil of 0.1 mm thickness, but the shaping of the permeable structures proceeds as indicated, such that said inlet channels 35 and outlet channels 40 are formed.

As is shown in FIG. 2, the lamellae 21 from the five steps 12 through 16 are each provided near one end with marks in the form of two rectangular, square or circular perforations. When mounting the lamellae package 9 the same lamellae can be used for steps 12 and 16, provided that they are mounted with their two rectangular perforations on the left and the right side, respectively, as indicated in FIG. 2. The same goes for the lamellae of steps 13 and 15 with square perforations on the left and the right side, respectively, as well as for the center group of lamellae 14 with circular perforations at the left and the right end.

Figure 9:
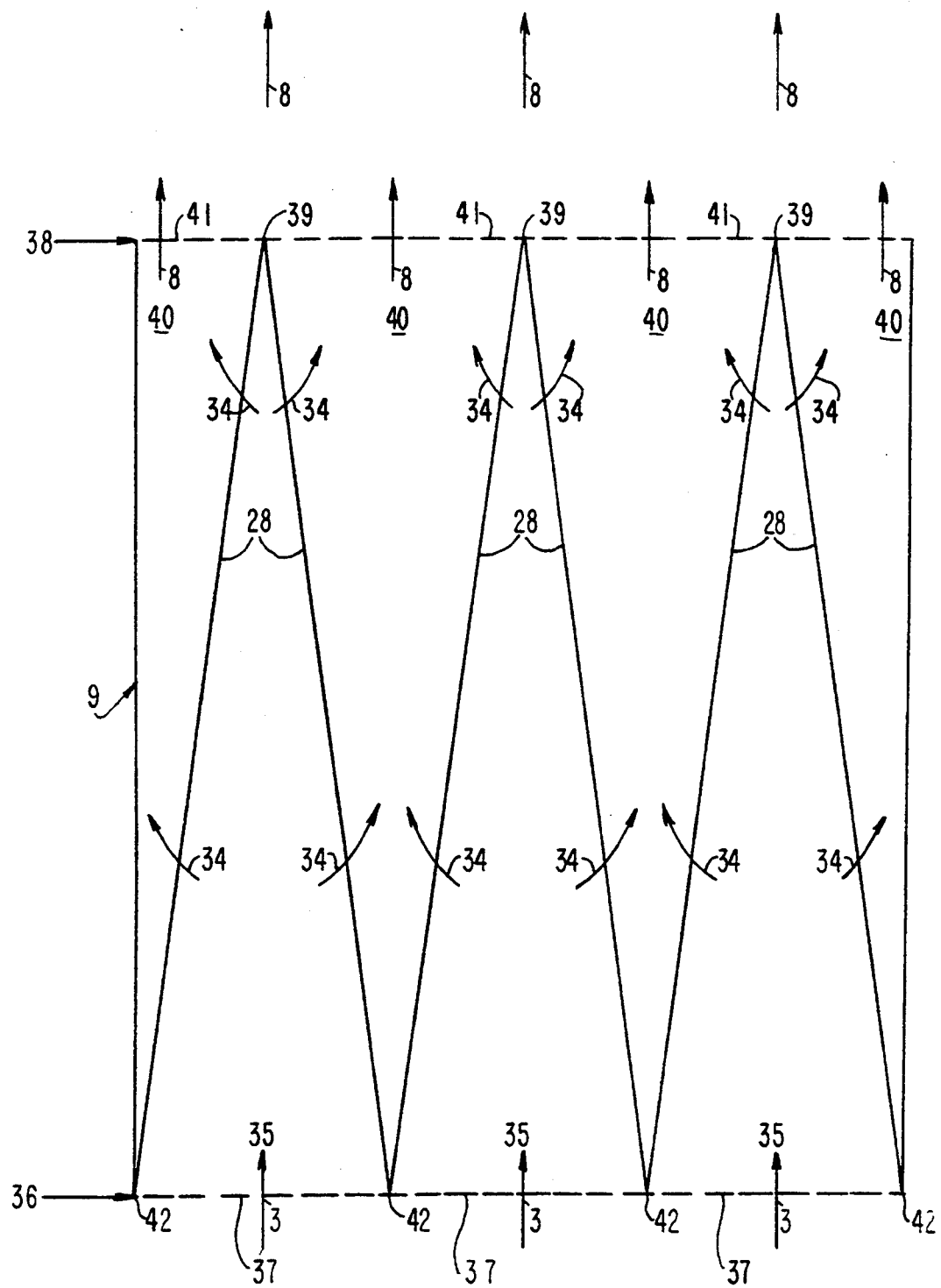
FIGS. 9 and 10 are top views of the course of a cooling medium's flow for slightly different embodiments of the heat exchanger.
Figure 10:
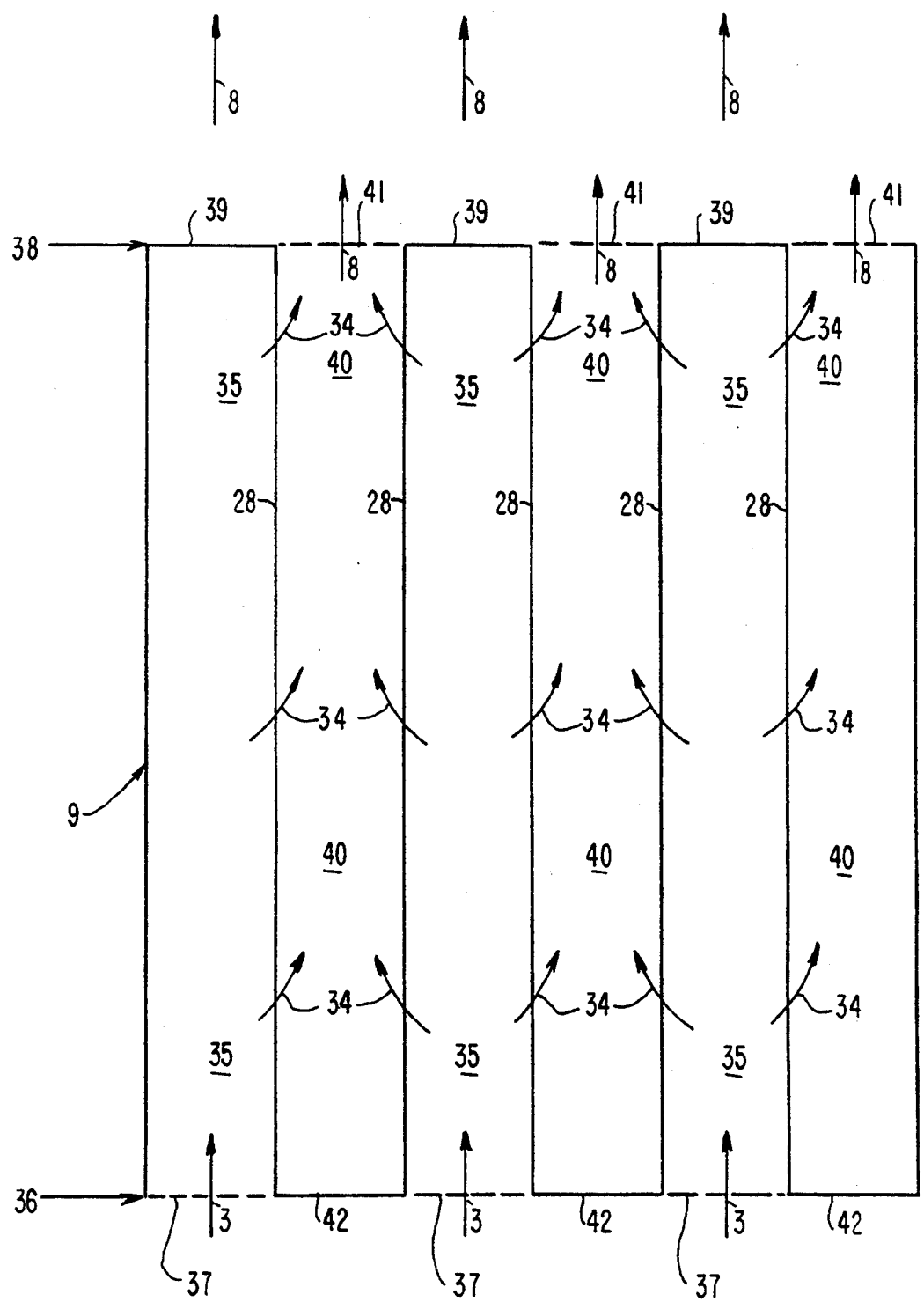

FIGS. 9 and 10 show simplified top views comparable with that of FIG. 4 of somewhat differently constructed lamellae packages for the heat exchanger according to the invention. Corresponding parts are indicated with the same reference numerals in FIGS. 9 and 10. In the construction according to FIG. 9, the width of the inlet channels 35 and the outlet channels 40 is not subject to stepwise but to gradual modification. In the construction according to FIG. 10, the width of the inlet or feed channels 35 and the outlet or discharge channels 40 remains even over the entire length. In contradistinction to the drawn embodiment, the feed channels 35 and the discharge channels 40 may also, in principle, extend inclined, say at an angle of 45°, to the longitudinal direction of the lamellae.

Figure 7:
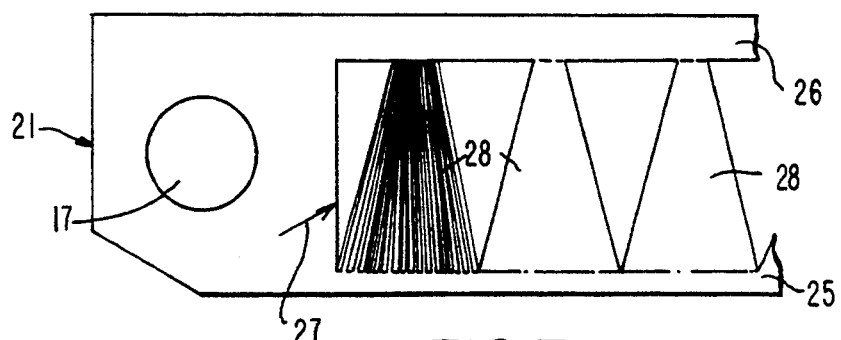
FIG. 7 is a view of a differently constructed lamella.

FIG. 7 is a highly schematic view of another greatly modified embodiment of a type of lamella to be used in the heat exchanger according to the invention, with corresponding parts indicated with the same reference numerals. In this case also the permeable structure 28 has the form of a type of lattice with straight lattice bars. The difference between the lamella according to FIG. 7 and the lamellae as described in the other embodiments resides in that the top strips 29 described hereinbefore are omitted (see FIG. 6), so that the tops of the permeable structures 28 blend directly with the bearing strip 26.

Within the scope of the invention various changes can be made. The heat exchanger according to the invention can be used either for cooling various devices or for heating them. Although it is preferred to make use of a gaseous cooling or heating medium, more particularly air, in the heat exchanger according to the invention, it is also possible to use a liquid cooling or heating medium if so desired.

Figure 1:
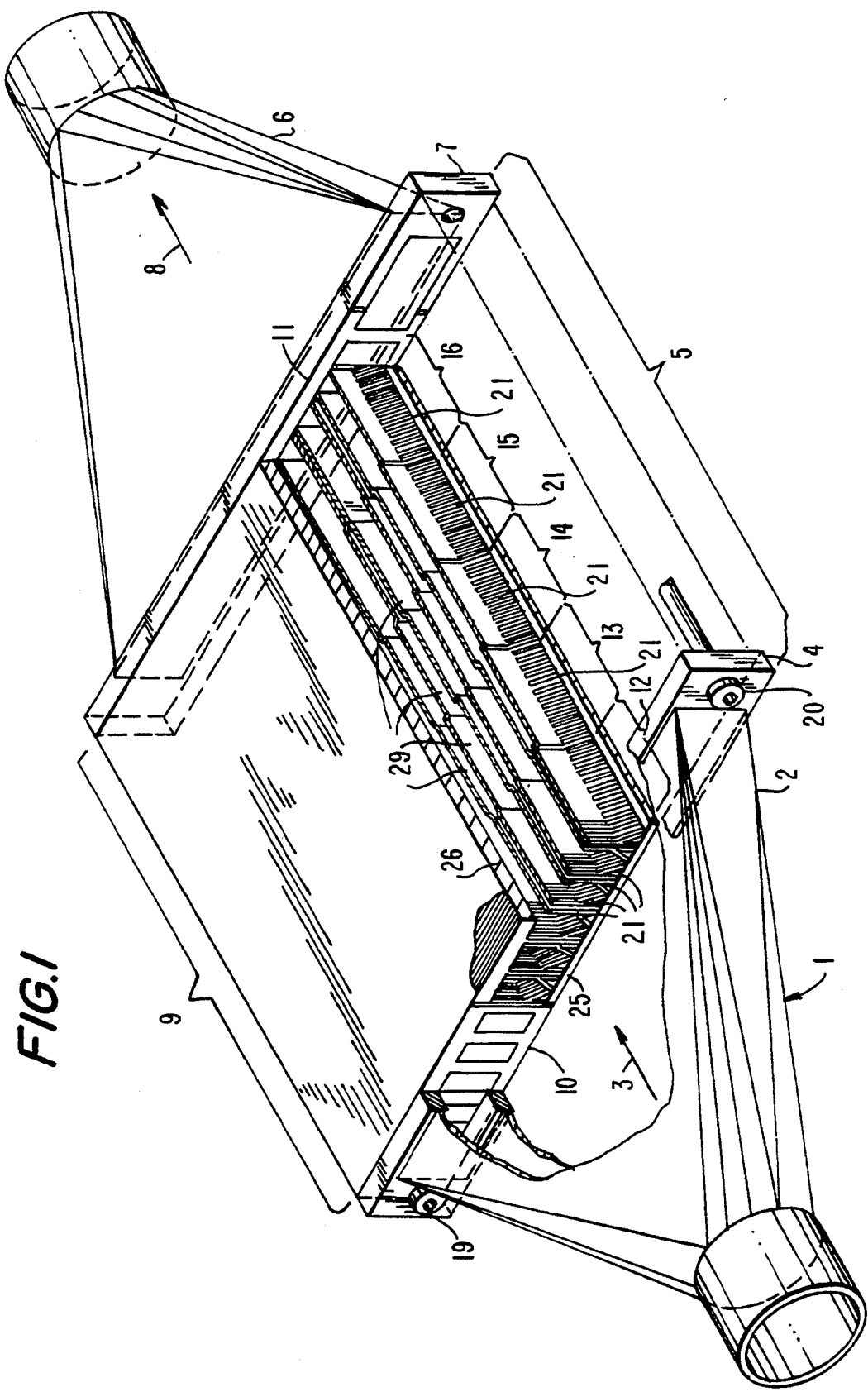
FIG. 1 is a partially cut-away view of the heat exchanger according to the invention.

By and large, for the preferred application of the heat exchanger according to the invention in a semiconductor module use may be made of the installation shown in FIGS. 1 and 9 of European Patent Publication No. 376,365, with the heat exchanger according to European Patent Publication No. 376,365 having been replaced by the heat exchanger comprised of lamellae according to the invention. Said permeable structure need not be formed by straight lattice bars. It can also be composed of a randomly shaped structure, e.g. a fine mesh.

Optionally, an additional solid sheet of high thermal conducting material may be placed against the ground flat base plate made up of the lamellae base strips. This solid sheet will then conduct the transfer of heat from the source of heat to be cooled down to the heat exchanger according to the invention.

Figure 11:
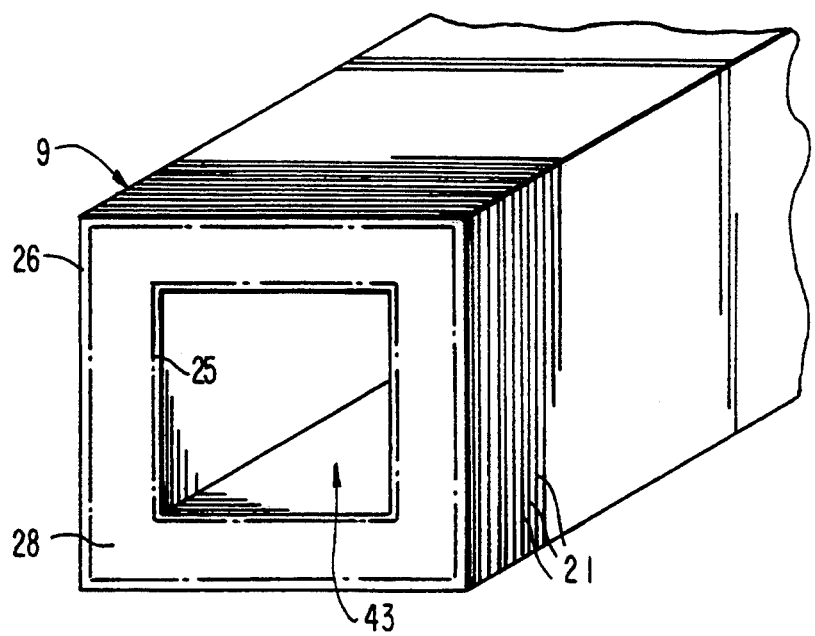
FIGS. 11 and 12 are views of square and cylindrical annular lamellae packages.
Figure 12:
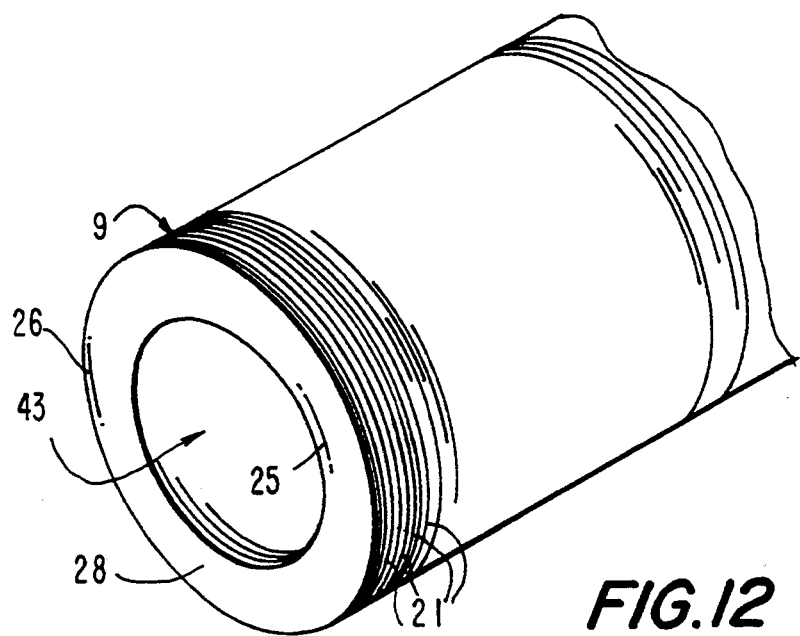

The heat exchangers according to the invention described hereinbefore extend in a flat plane. Alternatively, however, according to the invention the heat exchanger can have the hollow block shape with square cross-section shown in FIG. 11. In that case, the lamellae 21 described hereinbefore will take the form of a square ring, optionally divided up into four sides, with base strips 25 and bearing strips 26 analogous to those of the flat heat exchanger construction described above. Inside the square annular lamellae package 9 of, say, 1000 lamellae will be the heat generating device 43 which has to be cooled. Shown in FIG. 12 is a lamellae package 9 which comprises a plurality of, say, 1000 0.1 mm thick lamellae in the form of a circular ring. According to the invention, in addition to the square and circular lamellae packages 9 shown in FIGS. 11 and 12 other shapes can be employed, such as elliptic, hexagonal or other polygonal shapes, depending on the application. The embodiments of the heat exchanger according to the invention shown in FIGS. 11 and 12 are particularly suitable for cooling lasers or engines.

Further, the heat exchanger according to the invention can advantageously be used in cooling integrated circuits, in airplanes and satellites, linear and other engines, lasers and central processing units (CPUs). The heat exchanger according to the invention can also be utilized for space heating, printed circuit boards with heat generating components, and applications with a high heat flux per unit of volume in general.

I claim:

1. A heat exchanger having on a first and a second side inlets and outlets, respectively, for a heat exchanging medium and having a heat exchanging component made of a high thermal conductive material, in which the heat exchanging component has a structure permeable to the heat exchanging medium, and in which component channels positioned side by side and passing from the inlet side to the outlet side are formed, such that medium flowing in via the inlet channels can flow to adjacent outlet channels at an angle to the direction of entry, via the heat exchanging component, said high thermal conductive material being in the form of a number of lamellae assembled in the form of a package, the lamellae individually being permeable to the heat exchanging medium.

2. A heat exchanger according to claim 1 wherein said channels in the medium have been formed in the lamellae and are alternatingly connected to an inlet and an outlet for the medium.

3. A heat exchanger according to claim 1 wherein the lamellae are at least partially contacting, are made of a metal foil, and are of a thickness of 5 to 1000 $\mu$m.

4. A heat exchanger according to claim 3 wherein the desired permeable structure pattern, the inlet and outlet channel widths for the medium, and the base strip are formed in a foil by an operation preferably selected from the group of etching, build-up, and punching.

5. A heat exchanger according to claim 1 wherein in each lamella the permeable structure is made of the same metal foil and is formed integral with a base strip to which heat can be fed during operation, and the adjacent base strips of successive lamellae together form a base plate.

6. A heat exchanger according to claim 5 wherein the permeable structure in a lamella at the side facing away from the base strip is provided with a vertical top strip formed integral therewith, such that the top strips of successive lamellae form baffles for the medium.

7. A heat exchanger according to claim 5 wherein the base strip and the bearing strip in a lamella are joined at their ends to connecting strips formed integral therewith.

8. A heat exchanger according to claim 5 wherein the adjacent, base plate-forming base strips of successive lamellae are ground flat on the side facing away from the open structures.

9. A heat exchanger according to claim 1 wherein the lamellae forming the heat exchanging component are fixedly interconnected to form a package by means of two or more welding zones provided on the outside of the package.

10. A method of manufacturing the heat exchanger according to claim 1 wherein a plurality of lamellae having the desired permeable structure pattern and the inlet and outlet channel widths for the medium is assembled in the desired relative arrangement in the form of a package.

11. A method according to claim 10 wherein at least partially contacting lamellae are fixedly interconnected on the outside of the package.

12. A method according to claim 11 wherein the fixed interconnection is made with a laser beam or an electron beam.

13. A method according to claim 10 wherein the package of fixedly joined lamellae is ground flat on the base strip side of the lamellae facing away from the open structures.

14. A method according to claim 10 wherein the lamellae comprising the desired permeable structure pattern, the inlet and outlet channel widths for the medium, the base strip, and the bearing strip are made of a metal foil.

15. A method according to claim 14 wherein the production of the lamellae is by an operation selected from the group consisting of etching and punching.

16. A method according to claim 14 wherein a plurality of lamellae is formed side by side in a flat strip of foil.

17. A method according to claim 16 wherein the strip of foil containing a plurality of lamellae is conveyed to a place for mounting, where the lamellae are removed from the strip of foil and then assembled in the desired relative arrangement.

18. A method according to claim 10 wherein the lamellae having the desired permeable structure pattern, the inlet and outlet channel widths for the medium, the base strip, and the bearing strip are formed by the build-up of metal on a carrier in the desired pattern, followed by removal of the carrier.

19. A semiconductor module comprising at least one semi-conductor chip which at the back is connected to a heat exchanger according to claim 1.

20. A device for heating or cooling which comprises a power source and a heat exchanger according to claim 1.

21. A device for heating or cooling as claimed in claim 20 wherein the heat exchanger is combined with the power source.

22. A heat exchanger having on a first and second side inlets and outlets, respectively, for a heat exchanging medium, and having a heat exchanging component made of a high thermal conductive material in which the heat exchanging component has a structure permeable to the heat exchanging medium, and in which structure channels positioned side by side and passing from the inlet side to the outlet side are formed, such that medium flowing in via the inlet channels can flow to adjacent outlet channels at an angle to the direction of entry via the heat exchanging component, said heat exchanging component comprising a number of lamellae assembled in the form of a package, and wherein the lamellae are made of a metal foil in which the desired pattern of permeable structure and the width of the inlet and the outlet channels for the medium have been formed.

23. A heat exchanger according to claim 22 wherein the permeable structure in a lamella at the side opposite to the base strip is formed integral with a bearing strip.

24. A heat exchanger according to claim 23 wherein the top strips in a lamella are formed integral with the bearing strips.

25. A heat exchanger according to claim 22 wherein the permeable structure is formed by a lattice of lattice bars or wires disposed in the plane of a lamella.

26. A heat exchanger according to claim 25 wherein the lattice bars in the plane of the lamella have a width of 5 to 1000 $\mu$m.

27. A heat exchanger according to claim 26 wherein the permeable structure in a lamella has a gradually, narrowing width in the plane of the lamella in the direction away from the base strip.

28. A heat exchanger according to claim 27 wherein successive permeable structures in a lamella are not more than 5 to 1000 $\mu$m removed from each other where their widths at the base strip are greatest.

29. A heat exchanger according to claim 27 wherein the permeable structure in a lamella is formed by a group of lattice bars extending toward the base strip in the shape of a fan.

30. A heat exchanger according to claim 22 wherein the circumferential edges of the permeable structures of successive lamellae constitute permeable side walls of said inlet and outlet channels for the medium.

31. A heat exchanger according to claim 30 wherein lattice bars at the circumferential edges of the permeable structures in successive lamellae are staggered.

32. A heat exchanger according to claim 22 wherein the width of the inlet channels in the medium feed direction decrease while the width of the outlet channels in the medium discharge direction increases.

* * * * *